US007443268B2

(12) United States Patent
Tsai et al.

(10) Patent No.: US 7,443,268 B2
(45) Date of Patent: Oct. 28, 2008

(54) BANDPASS FILTER WITHIN A MULTILAYERED LOW TEMPERATURE CO-FIRED CERAMIC SUBSTRATE

(75) Inventors: Tsung-Ta Tsai, Tainan (TW); Jun-Zhe Huang, Tainan (TW)

(73) Assignee: Darfon Electronics Corp., Kweishan Taoyuan (TW)

( * ) Notice: Subject to any disclaimer, the term of this patent is extended or adjusted under 35 U.S.C. 154(b) by 31 days.

(21) Appl. No.: 11/210,892

(22) Filed: Aug. 25, 2005

(65) Prior Publication Data

US 2006/0043580 A1 Mar. 2, 2006

(30) Foreign Application Priority Data

Sep. 2, 2004 (TW) .............................. 93126505 A

(51) Int. Cl.
*H03H 7/01* (2006.01)

(52) U.S. Cl. ........................ 333/175; 333/204; 333/185

(58) Field of Classification Search ................. 333/175, 333/184, 185, 204
See application file for complete search history.

(56) References Cited

U.S. PATENT DOCUMENTS 5,357,227 A * 10/1994 Tonegawa et al. ........... 333/185
5,777,533 A * 7/1998 Kato et al. .................. 333/185
6,064,281 A * 5/2000 Sheen ........................ 333/175
6,542,053 B2 * 4/2003 Yamaguchi ................. 333/177
6,759,926 B2 * 7/2004 Yamaguchi ................. 333/175
7,012,484 B2 * 3/2006 Chang et al. ................ 333/175

* cited by examiner

*Primary Examiner*—Seungsook Ham
(74) *Attorney, Agent, or Firm*—Birch, Stewart, Kolasch & Birch, LLP

(57) ABSTRACT

A compact bandpass filter within a multilayered low temperature co-fired ceramic (LTCC) substrate is provided. Each resonator comprises an inductor and a capacitor connected in parallel. A top ceramic substrate comprises a top conductive plate to form a first RF ground plane. A bottom ceramic substrate comprises a bottom conductive plate to form a second RF ground plane. A first ceramic substrate is between the top and bottom ceramic substrates. All inductors of the resonators are serpentine conductive traces on the first ceramic substrate. A second ceramic substrate is between the first and bottom ceramic substrates, having a plurality of conductive plates to form a plurality of capacitors that transmit RF signal from an input node of the bandpass filter to an output node of the bandpass filter. The resonators are located between the too and bottom conductive plates.

12 Claims, 3 Drawing Sheets

BANDPASS FILTER WITHIN A MULTILAYERED LOW TEMPERATURE CO-FIRED CERAMIC SUBSTRATE

BACKGROUND

The invention relates in general to bandpass filters. More particularly, it relates to radio frequency (RF) bandpass filters within a multilayered low temperature co-fired ceramic (LTCC) substrate.

As integrated circuits (IC) technology advances, more devices and modules are integrated into single chips to provide system-on-chip (SOC) and system-in-package (SIP) feature. As a result, telecommunication system has been demanding SOCs or SIPs on compact portable communication devices. Telecommunication systems also often have RF modules that require passive devices, such as resistors, inductors and capacitors. Devices such as these present difficulty in size reduction while maintaining desired performance and function. Passive devices increase area or volume occupation as SOC or SIP size decrease. Therefore, it is important to reduce passive device size or/and integrate them into the circuit board where SOCs or SIPs are mounted.

For example, a bandpass filter (BPF) and a balance/unbalance transformer (Balun) may be needed in an RF front end. RF circuit design has incorporated most desired functions into one or more chips, but BPF and Balun are among the exceptions. A conventional method of providing BPF and Balun in a telecommunication system individually mounts them on the surface of a circuit board. Since BPF and Balun are among the thickest in comparison with other individual devices, size reduction of total system volume can be difficult.

One technique, seeing increased use in dealing with this difficulty, is use of multilayered LTCC substrates, wherein ICs and other chip components are mounted on the to surface, while passive devices are formed among the underlying layers. A traditional BPF in a multilayered LTCC substrate has coupled stripline elements to interact with an external, individual parallel-plate capacitor. To provide required coupling capacitance, the external parallel-plate capacitor cannot be overly thin, such that and the total system size is excessive.

SUMMARY

An object of the present invention is to provide a compact bandpass filter.

Another object of the present invention is to provide a bandpass filter within a multilayered LTCC substrate.

A bandpass filter is provided, comprising an input node, an output node and at least four substrates. A first substrate comprises a first conductive plate to form a first RF ground plane. A second substrate comprises five serpentine conductive traces and two conductive plates. A first serpentine conductive trace on the second substrate forms a first inductor and is coupled to the input node. A second conductive plate is coupled to the first conductive trace and substantially overlaps the first conductive plate. A second serpentine conductive trace forms a second inductor and is coupled to the second conductive plate. A third serpentine conductive trace forms a third inductor. A third conductive plate substantially overlaps the first conductive plate. A fourth serpentine conductive trace forms a fourth inductor and is coupled to the third conductive plate. A fifth serpentine conductive trace forms a fifth inductor and is coupled to the third conductive plate and the output node. A third substrate comprises fourth and Fifth conductive plates. The fourth conductive plate substantially overlaps the second conductive plate and is coupled to the second inductor. The fifth conductive plate substantially overlaps the third conductive plate and is coupled to the fourth conductive plate and the fourth inductor. A fourth substrate comprises a sixth conductive plate to form a second RF ground plane. The fourth and fifth conductive plates substantially overlap the sixth conductive plate. The first, third and fifth inductors are coupled to the first or second RF ground plane.

Another bandpass filter within a multilayered low temperature co-fired ceramic (LTCC) substrate is provided, comprising resonators, a top ceramic substrate, a bottom ceramic substrate, a first ceramic substrate, and a second ceramic substrate. Each resonator comprises an inductor and a capacitor connected in parallel. The top ceramic substrate comprises a top conductive plate to form a first RF ground plane. The bottom ceramic substrate comprises a bottom conductive plate to form a second RF ground plane. The first ceramic substrate is between the top and bottom ceramic substrates. All inductors of the resonators are serpentine conductive traces on the first ceramic substrate. The second ceramic substrate is between the first and bottom ceramic substrates, having a plurality of conductive plates to form a plurality of capacitors transmitting RF signal from an input node of the bandpass filter to an output node of the bandpass filter. The resonators are located between the top and bottom conductive plates.

DESCRIPTION OF THE DRAWINGS

For a better understanding of the present invention, reference is made to a detailed description to be read in conjunction with the accompanying drawings, in which.

DETAILED DESCRIPTION

Figure 1:
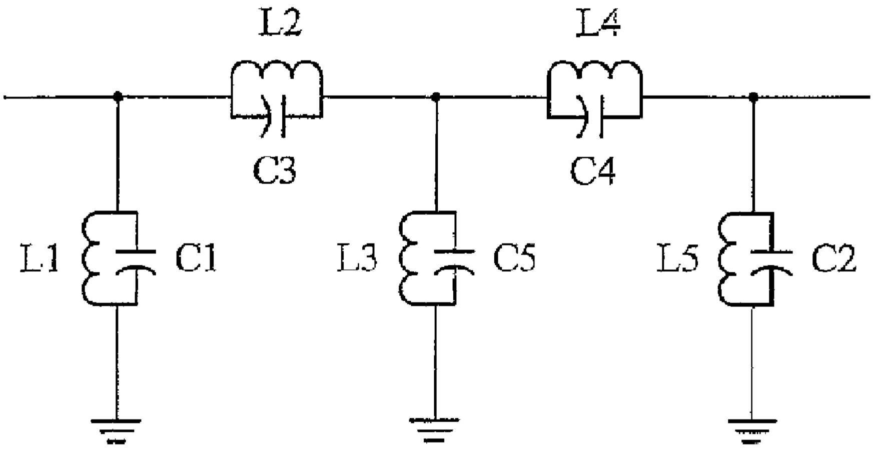
FIG. 1 RELATED ART
FIG. 1 shows a conventional BPF circuit.
Figure 2:
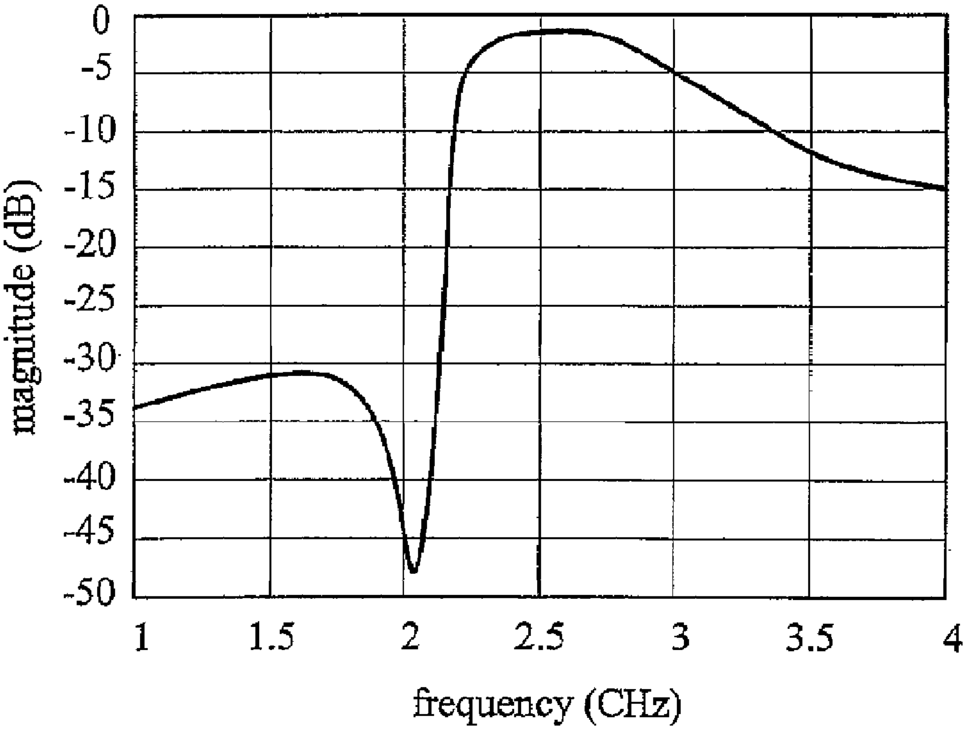
FIG. 2 shows a possible frequency response thereof.

FIG. 1 shows a conventional BPF circuit and FIG. 2 shows a possible frequency response thereof. Five resonators, as shown in FIG. 1, each substantially consists of an inductor and a capacitor connected in parallel. Inductor L1 and capacitor C1, inductor L3 and capacitor C5, and inductor L5 and capacitor C2 respectively construct three resonators, resonant frequencies of which determine the frequencies through the BPF or the passing range of the BPF. The remaining two resonators, as shown in the combination of inductor L2 and capacitor C3, and the combination of inductor L4 and capacitor C4, decide the stop band attitude and provide sufficient coupling capacitance for frequencies in the passing range. The coupling architecture of inductor L2, capacitor C3, inductor L4 and capacitor C4 provides an ideal BPF and abrupt declines outside the passing range.

Figure 3:
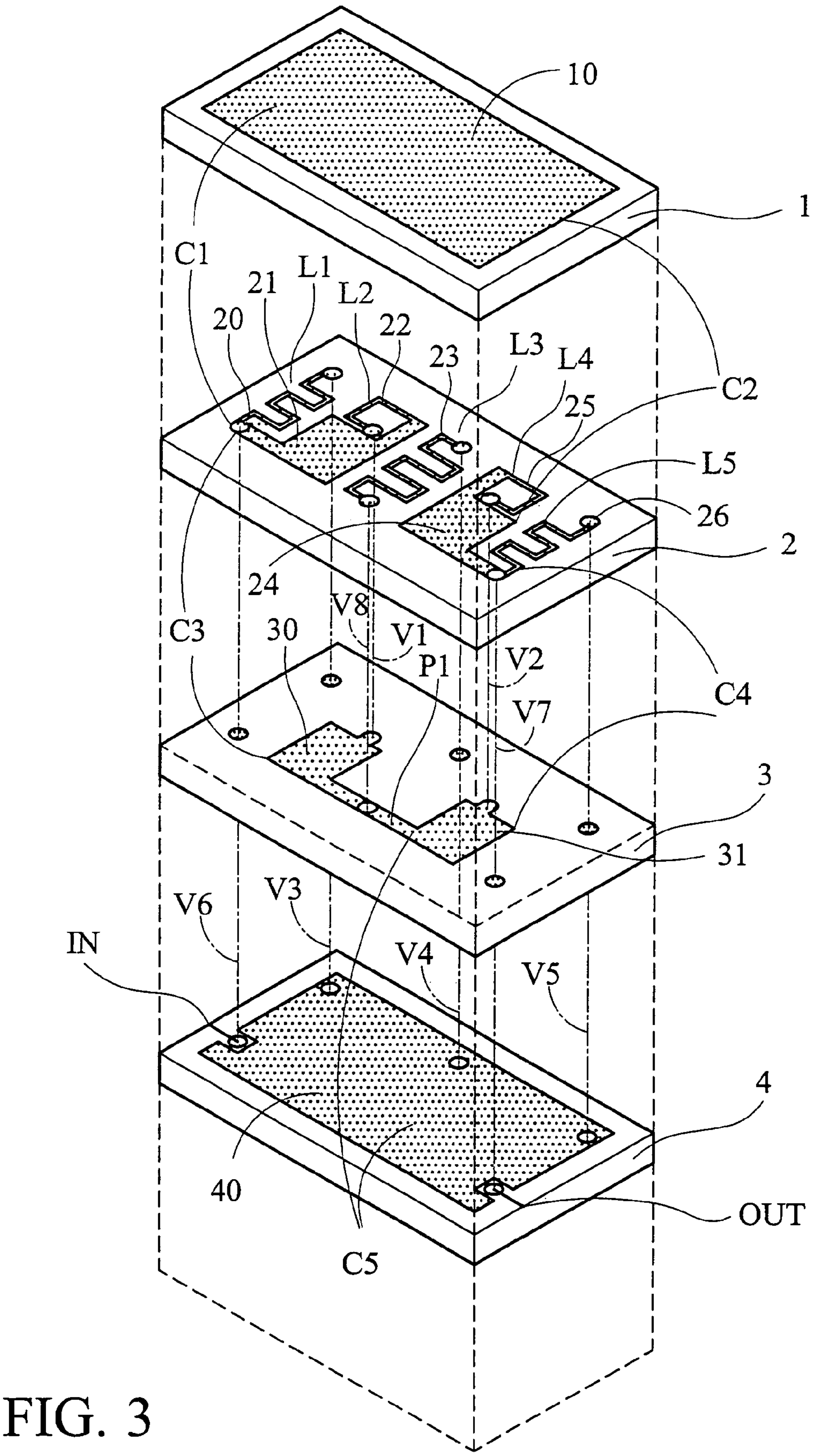
FIG. 3 shows a BPF according to an embodiment of the invention and the circuit in FIG. 1.

FIG. 3 shows a BPF according to an embodiment of the invention and the circuit in FIG. 1. FIG. 3 utilizes symbols in common with the components in FIG. 1 to show, but be not limited to, on FIG. 3 the corresponding structures or locations of the components.

The BPF in FIG. 3 has four substrates 1-4. In this embodiment, each substrate is a ceramic layer with a printed metallization pattern, creating passive devices. If required, a ceramic layer may have via holes filled with conductive material, such as silver or gold, for interlayer connection. Properly printed substrates can be registered, laminated and co-fired to form a hard circuit board receiving other electric components, such as SOCs or SIPs.

Substrate 1 comprises a conductive plate 10, and substrate 4 a conductive plate 40, providing two RF ground planes to confine RF signal, transmitted and filtered therebetween. Substrate 4 has input node IN and output node OUT, electrically isolated from conductive plate 40. RF signal is fed into input node IN to generate filtered RF signal at output node OUT.

Substrate 2 is located under substrate 1 and has serpentine conductive traces 20, 22-23, 25-26 and conductive plates 21 and 24 on its metallization pattern. Serpentine conductive trace 20 forms as inductor L1 with one end coupled to the input node IN on substrate 4, and another to conductive plate 40 on substrate 4. Conductive plate 21, while coupled to one end of serpentine conductive trace 20, substantially overlaps conductive plate 10 to form capacitor C1. In other words, conductive plate 21 and conductive plate 10 represent two parallel plates of capacitor C1, and the ceramic material of substrate 1 represents the isolation dielectric layer sandwiched therebetween. Serpentine conductive trace 22 forms inductor L2 and has one end coupled to conductive plate 21. Serpentine conductive-trace 23 forms inductor L3. Conductive plate 24, similar to conductive plate 21, substantially overlaps conductive plate 10 to form capacitor C2. Serpentine conductive traces 25 and 26 respectively form inductors L4 and L5, each having one end coupled to conductive plate 24, which is coupled to the output node OUT on substrate 4. Each of serpentine conductive traces 23 and 26 also has one end coupled to conductive plate 40 on substrate 4.

Between substrates 2 and 4 is substrate 3 with conductive plates 30 and 31. Conductive plate 30 substantially overlaps conductive plate 21 to form capacitor C3, and is coupled to an end of serpentine conductive trace 22. Conductive plate 31 substantially overlaps conductive plate 24 to form capacitor C4, and is coupled to an end of serpentine conductive traces 25. Both conductive plates 30 and 31 are further coupled to one end of serpentine conductive trace 23. Capacitor C5 is formed by conductive plates 30 and 31 on substrate 3 acting as a top plate and conductor plate 40 on substrate 4 as a bottom plate.

Via holes provide interlayer coupling between different substrates. Via hole V1 couples one end of serpentine conductive trace 22 on substrate 2 to conductive plate 30 on substrate 3. Via hole V2 couples one end of serpentine conductive trace 25 on substrate 2 to conductive plate 31 on substrate 3. Via holes V3, V4 and V5 provide terminal grounding to serpentine conductive traces 20, 23 and 26. In FIG. 3, via holes V3, V4 and V5 provide terminal grounding from conductive plate 40 on substrate 4. This kind of terminal grounding can be also provided from conductive plate 10 on substrate 1 in the presence of required via holes. Via holes V6 couple input node IN to conductive plate 21 while via holes V7 couple conductive plate 24 to output node OUT. Via hole V8 couples one end of serpentine conductive traces 23 to conductive plates 30 and 31.

Figure 4:
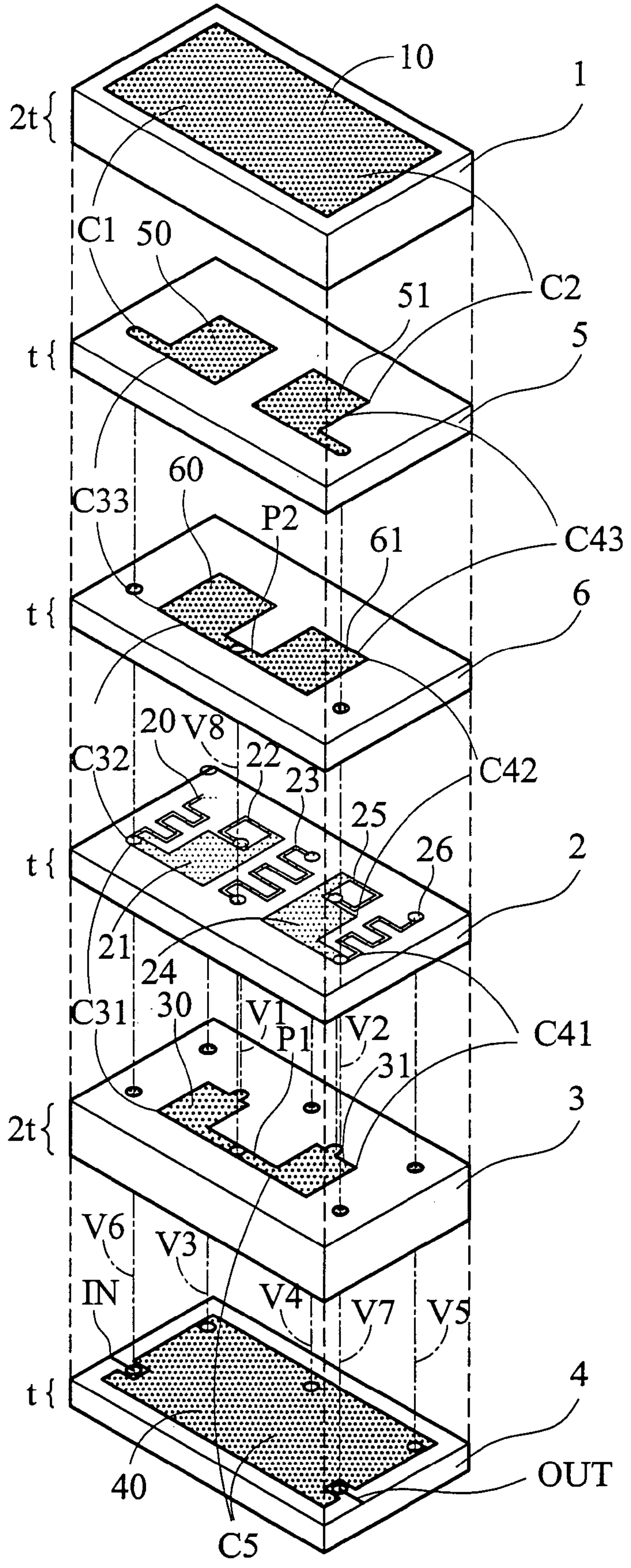
FIG. 4 shows another BPF according to an embodiment of the invention and the circuit in FIG. 1.

FIG. 4 shows another BPF according to an embodiment of the invention and the circuit in FIG. 1. In addition to the substrates in FIG. 3, substrates 5 and 6 between substrates 1 and 2 increase the capacitance of capacitors C3 and C4. Substrate 5 is between substrates 1 and 6, having separate conductive plates 50 and 51. Substrate 6 has conductive plates 60 and 61, coupled to each other. Both substrates 5 and 6 may have via holes for coupling or interlayer connection. As shown in FIG. 4, through via holes, conductive plate 50 is coupled to input node IN, conductive plate 51 to output node OUT, and conductive plates 60 and 61 to one end of serpentine conductive trace 23.

Due to the placement of substrates 5 and 6 in FIG. 4, some capacitors in FIG. 3 are relocated and new capacitors created. Capacitors C3 and C4 in FIG. 3 are re-symbolized as capacitors C31 and C41 in FIG. 4. Symbols C1 and C2 in FIG. 3 are relocated to the capacitors between conductive plates 50 and 10 and between conductive plates 51 and 10. Conductive plates 50 and 60 form capacitor C33, conductive plates 51 and 61 form capacitor C43, conductive plates 60 and 21 form capacitor C32, and conductive plates 61 and 24 form capacitor C42. According to the coupling in FIG. 4 and the schematic in FIG. 1, capacitors C31, C32 and C33 in FIG. 4 are coupled in parallel to represent capacitor C3 in FIG. 1, such that C3=C31+C32+C33. The same theory is applicable to capacitors C41, C42 and C43, and therefore the capacitance of capacitor C4 in FIG. 1 is equal to the capacitance sum of capacitors C41, C42, and C43 in FIG. 4. Comparing FIG. 4 to FIG. 3, the capacitance of the equivalent C3 in FIG. 4, equal to the sum of C31; C32 and C33, exceeds the capacitance of capacitor C3 in FIG. 3, equal to C31 only. In other words, inserting substrates 5 and 6 in FIG. 4 increases the capacitance of capacitors C3 and C4 in FIG. 1. In FIG. 1, capacitors C3 and C4 are connected in series to transmit RF signal from an input to an output. Therefore, capacitors C3 and C4 with higher capacitance can improve AC coupling and reduce signal loss.

To prevent capacitance of C1, C2, and C5 from providing excessive ground coupling to RF signal, outmost conductive plates 10 and 40 can be placed further away from other conductive plates laminated therebetween. In FIG. 4, the distance is achieved by providing thicker substrates 1 and 3. For example, each substrate thickness for substrates 1 and 3 can be 2t while that for substrates 2, 5 and 6 is t.

The embodiments in FIG. 3 and 4 provide physical serpentine conductive traces to represent inductors and actualize the schematic in FIG. 1. Because the serpentine conductive traces are properly interleaved with conductive plates and crooked to have sufficient inductance, all the inductors can be densely placed on the same substrate, thereby decreasing the number of substrates required and the total thickness and size for the final product. While capacitors C3 and C4 with larger capacitance reduce signal loss in the passing frequency range, some substrates can be thicker than others and reduce the grounding effect introduced by the ground planes.

While the invention has been described by way of examples and in terms of preferred embodiments, it is to be understood that the invention is not limited thereto the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bandpass filter, comprising:

an input node;

an output node;

a first substrate with a first conductive plate forming a first RF ground plane;

a second substrate, comprising:

a first serpentine conductive trace forming a first inductor and coupled to the input node;

a second conductive plate coupled to the first serpentine conductive trace and substantially overlapping the first conductive plate;

a second serpentine conductive trace forming a second inductor and coupled to the second conductive plate;

a third serpentine conductive trace forming a third inductor;

a third conductive plate, substantially overlapping the first conductive plate;

a fourth serpentine conductive trace forming a fourth inductor and coupled to the third conductive plate; and a fifth serpentine conductive trace forming a fifth inductor and coupled to the third conductive plate and the output node;

a third substrate, comprising:

a fourth conductive plate, substantially overlapping the second conductive plate and coupled to the second inductor; and a fifth conductive plate, substantially overlapping the third conductive plate and coupled to the fourth conductive plate and the fourth inductor; and a fourth substrate with a sixth conductive plate to form a second RF ground plane, the fourth and fifth conductive plates substantially overlapping the sixth conductive plate;

wherein the first, third and fifth inductors are coupled to one of the first and second RF ground planes.

2. The bandpass filter as claimed in claim 1, wherein the first to fourth substrates are ceramic.

3. The bandpass filter as claimed in claim 1, wherein the first, third and fifth inductors are coupled to the second RF ground plane through via holes.

4. The bandpass filter as claimed in claim 1, wherein the fourth conductive plate substantially overlaps the second conductive plate to form a third capacitor and the fifth conductive plate substantially overlaps the third conductive plate to form a fourth capacitor, and the third and fourth capacitors are respectively coupled to the second and fourth inductors through vias.

5. The bandpass filter as claimed in claim 1, wherein the input and output nodes are on the fourth substrate and are coupled to the second and third conductive plates though via holes.

6. The bandpass filter as claimed in claim 1, further comprising:

a fifth substrate between the first and the second substrates, comprising:

seventh and eightieth conductive plates, respectively coupled to the input and output nodes; and a sixth substrate between the second and the fifth substrates, comprising:

ninth and tenth conductive plates, coupled to each other and to the third inductor though a via holes.

7. The bandpass filter as claimed in claim 6, wherein the first and third substrates are thicker than at least one of the second, fourth, fifth and sixth substrates.

8. The bandpass filter as claimed in claim 7, wherein each of the first and third substrates has a thickness twice that of at least one of the second, fourth, fifth and sixth substrates.

9. The bandpass filter as claimed in claim 6, wherein the fifth and sixth substrates are ceramic.

10. A bandpass filter within a multilayered low temperature co-fired ceramic (LTCC) substrate, comprising:

resonators, each comprising an inductor and a capacitor connected in parallel;

a top ceramic substrate with a top conductive plate forming a first RF ground plane;

a bottom ceramic substrate with a bottom conductive plate forming a second RF ground plane;

a first ceramic substrate between the top and bottom ceramic substrates, comprising a first serpentine conductive trace forming a first inductor and coupled to the input node;

a first conductive plate coupled to the first serpentine conductive trace;

a second serpentine conductive trace forming a second inductor and coupled to a second conductive plate:

a third serpentine conductive trace forming a third inductor;

a fourth serpentine conductive trace forming a fourth inductor; and a fifth serpentine conductive trace forming a fifth inductor and coupled to a third conductive plate and the output node; and a second ceramic substrate between the first and bottom ceramic substrates, having a plurality of conductive plates to form a plurality of capacitors transmitting RF signal from an input node of the bandpass filter to an output node of the bandpass filter;

wherein the resonators are located between the top and bottom conductive plates.

11. The bandpass filter as claimed in claim 10, the second ceramic substrate comprising:

a fourth conductive plate, coupled to the second inductor; and a fifth conductive plate, coupled to the fourth conductive plate and the fourth inductor;

wherein the first conductive plate overlaps the second conductive plate to form a first capacitor, and the third conductive plate overlaps the first conductive plate to form a second capacitor.

12. The bandpass filter as claimed in claim 11, wherein the fourth conductive plate substantially overlaps the second conductive plate to form a third capacitor and the fifth conductive plate substantially overlaps the third conductive plate to form a fourth capacitor.

* * * * *